(12) United States Patent
Suzuki et al.

(10) Patent No.: US 9,865,467 B2
(45) Date of Patent: Jan. 9, 2018

(54) RECESS FILLING METHOD AND PROCESSING APPARATUS

(71) Applicant: TOKYO ELECTRON LIMITED, Tokyo (JP)

(72) Inventors: Daisuke Suzuki, Nirasaki (JP); Youichirou Chiba, Nirasaki (JP); Takumi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/919,381

(22) Filed: Oct. 21, 2015

(65) Prior Publication Data

US 2016/0126103 A1 May 5, 2016

(30) Foreign Application Priority Data

Oct. 29, 2014 (JP) .................................. 2014-220542

(51) Int. Cl.
*H01L 21/285* (2006.01)
*H01L 21/02* (2006.01)
(Continued)

(52) U.S. Cl.
CPC ...... *H01L 21/28525* (2013.01); *C23C 16/045* (2013.01); *C30B 1/023* (2013.01); *C30B 29/06* (2013.01); *C30B 29/08* (2013.01); *H01L 21/0243* (2013.01); *H01L 21/0245* (2013.01); *H01L 21/0262* (2013.01);
(Continued)

(58) Field of Classification Search
CPC ............. H01L 21/0243; H01L 21/0245; H01L 21/76843; H01L 21/76876; H01L 21/076871; C30B 29/06; C30B 20/08; C30B 1/02; C23C 16/045
See application file for complete search history.

(56) References Cited

U.S. PATENT DOCUMENTS 5,888,876 A * 3/1999 Shiozawa ............. H01L 21/763
257/E21.396
6,410,455 B1 * 6/2002 Kuribayashi ..... H01L 21/67742
414/217

(Continued)

FOREIGN PATENT DOCUMENTS

JP 10-56154 A 2/1998

*Primary Examiner* — Caridad Everhart
(74) *Attorney, Agent, or Firm* — Nath, Goldberg & Meyer; Jerald L. Meyer

(57) ABSTRACT

There is provided a method of filling a recess of a workpiece, which includes: forming a first thin film made of a semiconductor material along a wall surface defining a recess in a semiconductor substrate; annealing the workpiece within a vessel whose internal process is set to a first pressure, and forming an epitaxial region which is generated by crystallizing the semiconductor material of the first thin film, along a surface defining the recess, without moving the first thin film; forming a second thin film made of the semiconductor material along the wall surface defining the recess; and annealing the workpiece within the vessel whose internal pressure is set to a second pressure lower than the first pressure, and forming a further epitaxial region which is generated by crystallizing the semiconductor material of the second thin film which is moved toward a bottom of the recess.

6 Claims, 6 Drawing Sheets

(51) Int. Cl.
*H01L 21/306* (2006.01)
*H01L 21/324* (2006.01)
*H01L 21/768* (2006.01)
*C30B 1/02* (2006.01)
*C30B 29/06* (2006.01)
*C30B 29/08* (2006.01)
*H01L 21/74* (2006.01)
*C23C 16/04* (2006.01)

(52) U.S. Cl.
CPC .. *H01L 21/02532* (2013.01); *H01L 21/02576* (2013.01); *H01L 21/02579* (2013.01); *H01L 21/28556* (2013.01); *H01L 21/324* (2013.01); *H01L 21/743* (2013.01); *H01L 21/76843* (2013.01); *H01L 21/76876* (2013.01); *H01L 21/76879* (2013.01)

(56) References Cited

U.S. PATENT DOCUMENTS

| | | | |
|---|---|---|---|
| 6,552,380 B1* | 4/2003 | Sato | H01L 21/30604 257/301 |
| 2003/0157781 A1* | 8/2003 | Macneil | H01L 21/76224 438/424 |
| 2006/0183326 A1* | 8/2006 | Yoo | H01L 21/76882 438/687 |

* cited by examiner

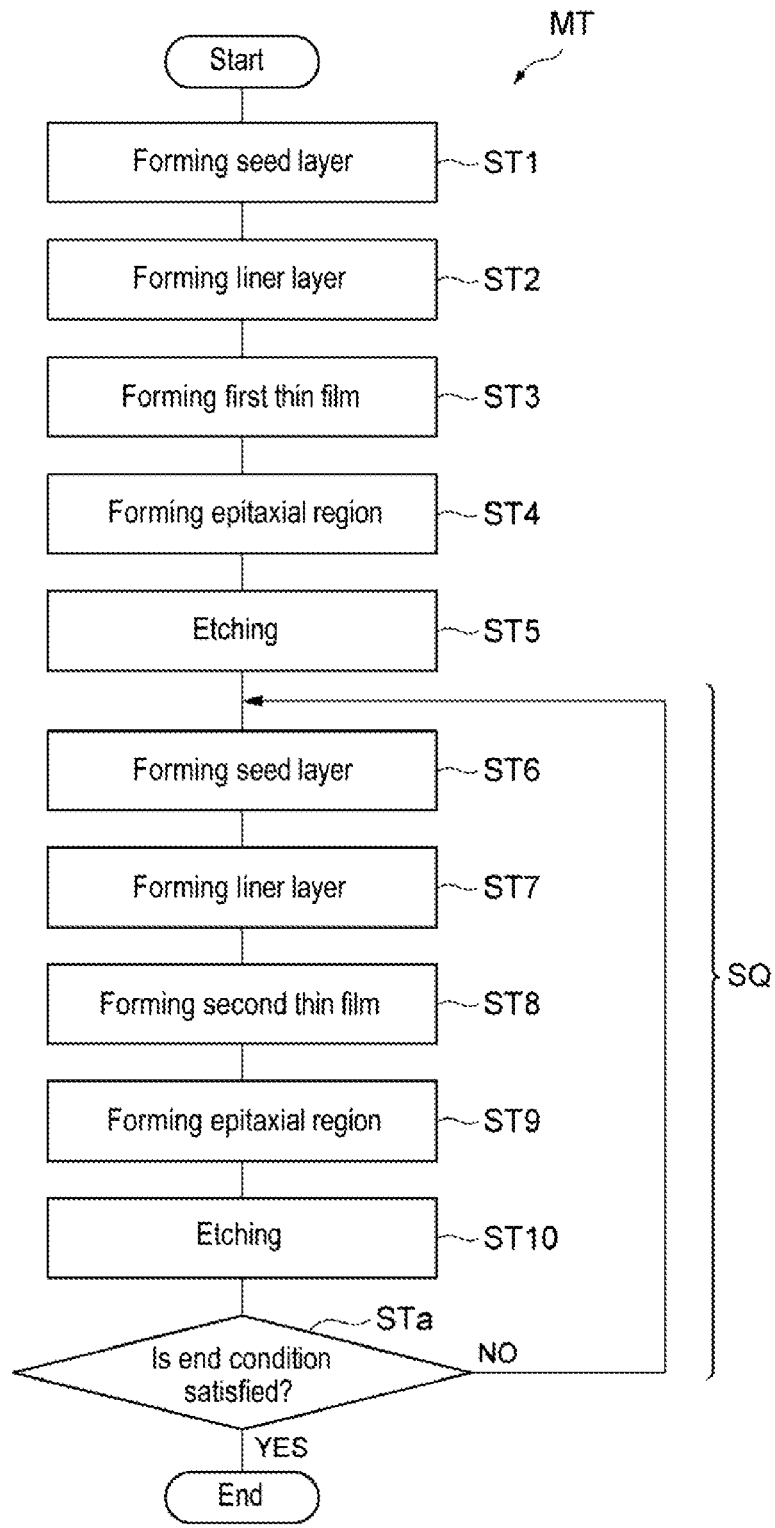

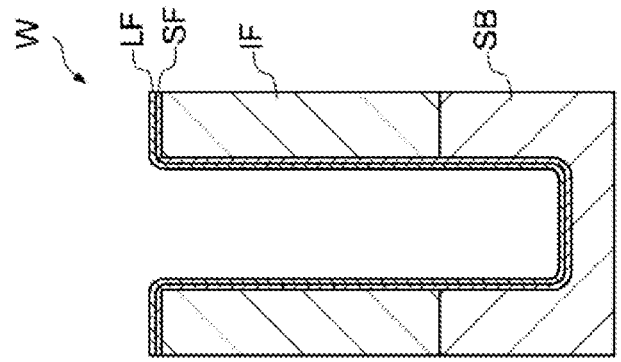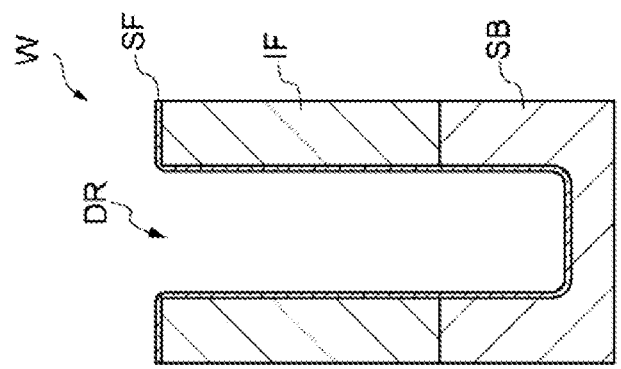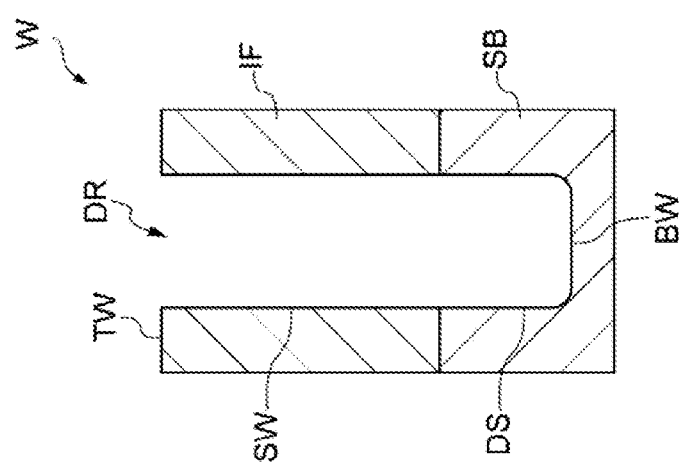

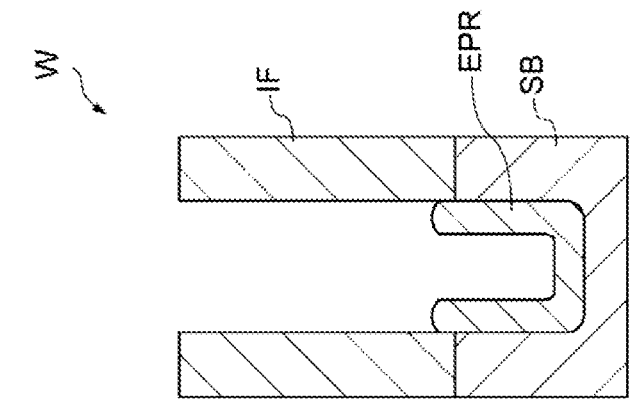
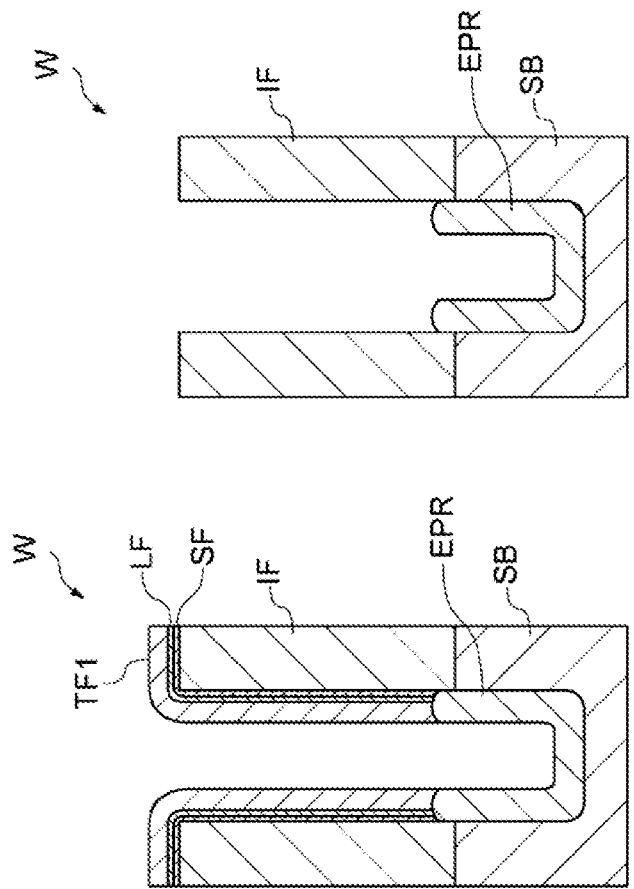
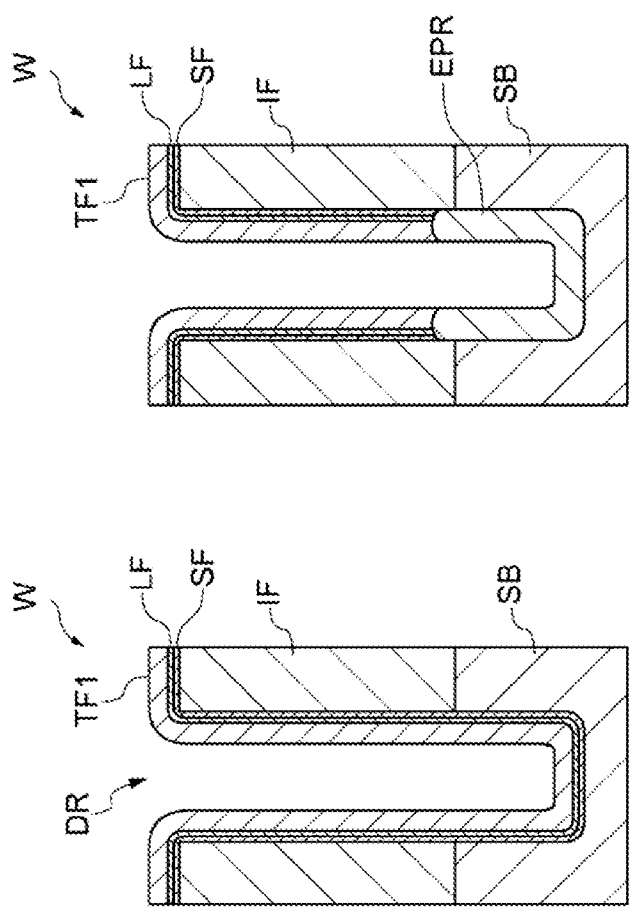

RECESS FILLING METHOD AND PROCESSING APPARATUS

CROSS-REFERENCE TO RELATED APPLICATION

This application claims the benefit of Japanese Patent Application No. 2014-220542, filed on Oct. 29, 2014, in the Japan Patent Office, the disclosure of which is incorporated herein in its entirety by reference.

TECHNICAL FIELD

The present disclosure relates to a recess filling method and a processing apparatus.

BACKGROUND

In manufacturing a device such as a semiconductor device, a process of filling silicon into a recess such as a through-hole or a contact hole is performed. The silicon filled into the recess may be used as, for example, an electrode.

Specifically, in such a filling process, a polycrystalline silicon film is formed on a wall surface defining a trench in a workpiece. Thereafter, an amorphous silicon film is formed on the polycrystalline silicon film. Subsequently, the workpiece is annealed. In the filling process, the annealing of the workpiece allows the amorphous silicon to move toward a bottom portion of the trench, thus filling the trench with the amorphous silicon.

The recess may be formed to penetrate an insulating film and extend to an inside of a semiconductor substrate used as an underlying layer of the insulating film. The recess is formed by etching the insulating film and the semiconductor substrate. The present inventors have studied a technique for filling a recess by movement of a semiconductor material toward a bottom portion of the recess; and crystallizing the semiconductor material of the semiconductor substrate to form an epitaxial region.

In this study, the present inventors have found that a region that causes damage by etching (hereinafter, referred to as a "damage region") is sometimes formed on a surface defining the recess in the semiconductor substrate, which fails to undergo an epitaxial growth at the damage region, thus generating a cavity such as a void in the recess.

SUMMARY

Some embodiments of the present disclosure provide to a technique for filling a recess through an epitaxial growth of a semiconductor material, without generating a void in the recess.

According to one embodiment of the present disclosure, there is provided a method of filling a recess of a workpiece, the workpiece having a semiconductor substrate and an insulating film formed on the semiconductor substrate, the recess penetrating the insulating film and extending to an inside of the semiconductor substrate, the method including: forming a first thin film made of a semiconductor material along a wall surface defining the recess in the semiconductor substrate; annealing the workpiece within a vessel whose internal process is set to a first pressure, and forming an epitaxial region which is generated by crystallizing the semiconductor material of the first thin film, along a surface defining the recess in the semiconductor substrate, without moving the first thin film; forming a second thin film made of the semiconductor material along the wall surface defining the recess; and annealing the workpiece within the vessel whose internal pressure is set to a second pressure lower than the first pressure, and forming a further epitaxial region which is generated by crystallizing the semiconductor material of the second thin film which is moved toward a bottom of the recess According to another embodiment of the present disclosure, there is provided a processing apparatus, which including: a vessel; a gas feeding part configured to supply a first gas for forming a first thin film made of a semiconductor material and a second gas for forming a second thin film made of the semiconductor material, into the vessel; a heating device configured to heat an internal space of the vessel; an exhaust device configured to decompress the internal space of the vessel; and a control part configured to control the gas feeding part, the heating device and the exhaust device. The control part executes: a first control in which the gas feeding part is controlled to supply the first gas into the vessel; a second control in which the exhaust device is controlled such that a pressure of the internal space of the vessel is set to a first pressure and in which the heating device is controlled to heat the internal space of the vessel; third control in which the gas feeding part is controlled to supply the second gas into the vessel; and fourth control in which the exhaust device is controlled such that the pressure of the internal space of the vessel is set to a second pressure lower than the first pressure and in which the heating device is controlled to heat the internal space of the vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a recess filling method according to an embodiment of the present disclosure.

FIG. 2A is a cross sectional view illustrating an initial state of a workpiece before the recess filling method of FIG. 1 is performed, and FIGS. 2B and 2C are cross sectional views illustrating states of the workpiece after respective processes of the recess filling method are performed.

FIGS. 3A to 3C and 4A to 4C are cross sectional views illustrating states of the workpiece after the respective processes of the recess filling method of FIG. 1 are performed.

DETAILED DESCRIPTION

Figure 4A:
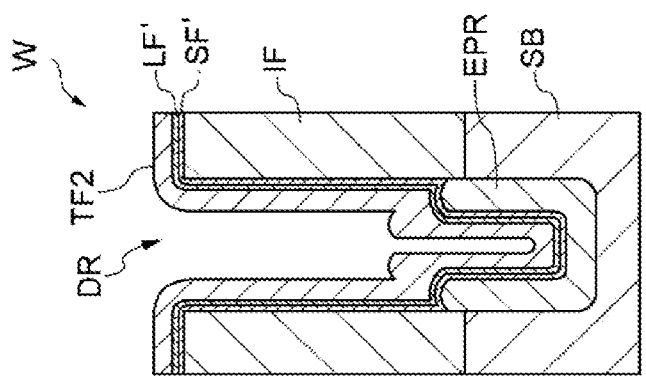

Reference will now be made in detail to various embodiments, examples of which are illustrated in the accompanying drawings. In drawings, like reference numerals will be assigned to the same or corresponding parts. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a flowchart illustrating a recess filling method MT according to an embodiment of the present disclosure. FIG. 2A is a cross sectional view illustrating an initial state of an workpiece before the recess filling method shown in FIG. 1 is performed, and FIG. 2B and 2C are cross sectional views illustrating states of the workpiece after respective processes of the recess filling method are performed. FIGS. 3A to 3C and 4A to 4C are cross sectional views illustrating states of the workpiece after the respective processes of the recess filling method shown in FIG. 1 are performed. The method MT shown in FIG. 1 is to fill a recess of the workpiece by epitaxially growing a semiconductor material in the recess.

Before the method MT is applied, the workpiece (hereinafter, referred to sometimes as a "wafer W") has an initial state as shown in FIG. 2A. That is to say, the wafer W includes a semiconductor substrate SB and an insulating film IF. An example of the semiconductor substrate SB may include a single crystalline semiconductor substrate (e.g., a single crystalline silicon substrate) or a polycrystalline semiconductor substrate (e.g., a polycrystalline silicon substrate). The insulating film IF is formed on the semiconductor substrate SB. For example, the insulating film IF is made of a silicon oxide ($SiO_2$) or a silicon nitride ($Si_3N_4$).

A recess DR such as a trench or a hole is formed in the wafer W. The recess DR is formed to extend up to an inside of the semiconductor substrate SB while penetrating the insulating film IF in a thickness direction. For example, the recess DR may have a depth of 200 nm and a width ranging from 40 to 50 nm. The recess DR may be formed by etching the insulating film IF and the semiconductor substrate SB using a mask formed on the insulating film IF. This etching may generate a damage region in a surface DS defining the recess DR of the semiconductor substrate SB. Also, the damage region, which is a region having a state different from other regions in the surface DS, may be formed by an element (e.g., carbon) contained in an etching gas, which is left in a non-removed state after etching.

In the method MT, steps ST3, ST4, ST8, and ST9 are performed on the wafer W shown in FIG. 2A. In one embodiment, a sequence SQ including steps ST8 and ST9 may be repeated. In some embodiments, one or more of steps ST1, ST2, ST5, ST6, ST7, and ST10 may be performed. These steps ST6, ST7, and ST10 are included in the sequence SQ.

Figure 5:
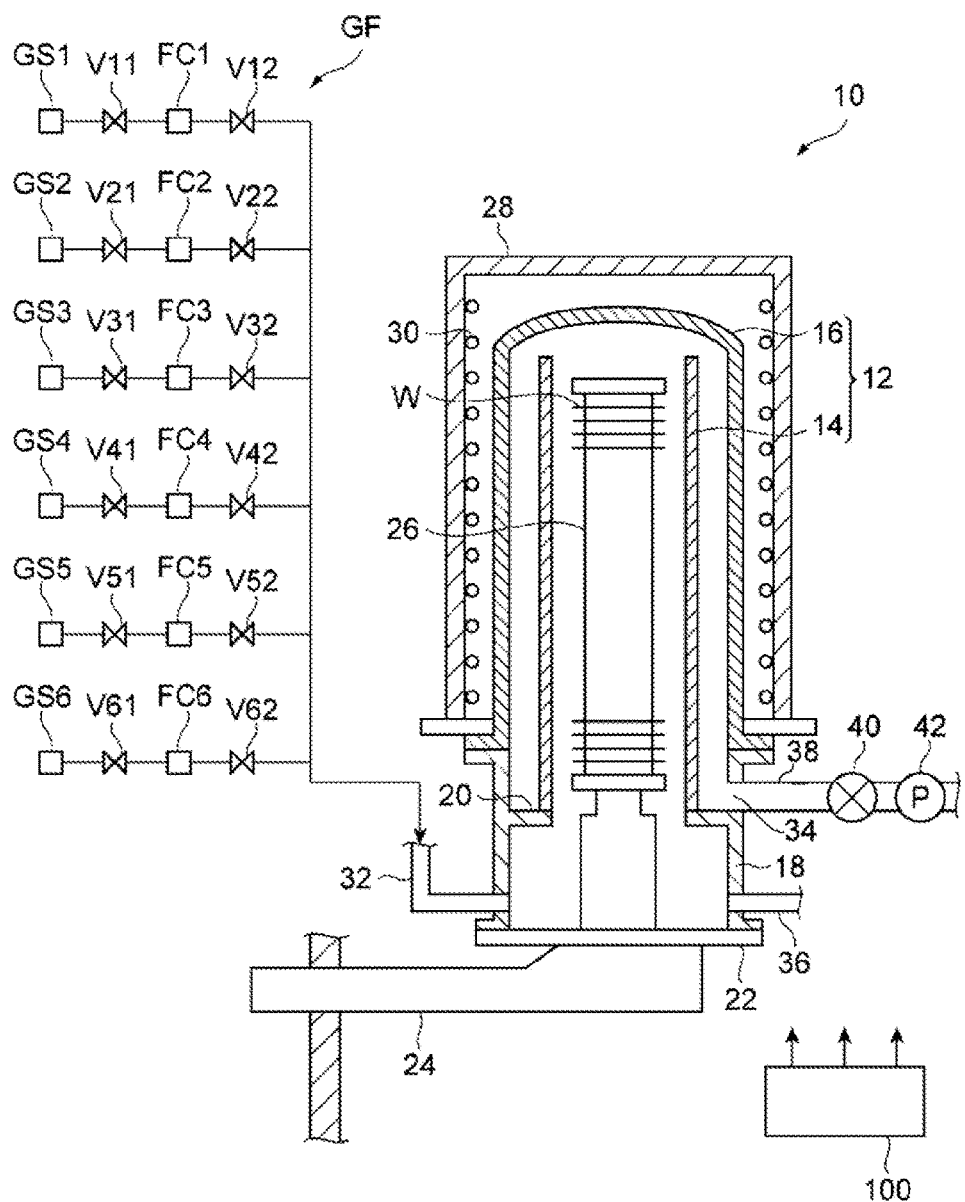
FIG. 5 is view schematically illustrating a processing apparatus which is capable of being used in implementing the recess filling method shown in FIG. 1.

Next, a processing apparatus according to another embodiment of the present disclosure, which is capable of being used in performing the recess filling method MT, will be described. FIG. 5 is a view schematically illustrating a processing apparatus 10 which is capable of being used in performing the recess filling method shown in FIG. 1. The processing apparatus 10 shown in FIG. 5 includes a vessel 12. The vessel 12 is a reaction tube having a substantially cylindrical shape. A length direction of the vessel 12 corresponds to a vertical direction. The vessel 12 has a double tube structure composed of an inner tube 14 and an outer tube 16. The inner tube 14 and the outer tube 16 are formed of a material (e.g., quartz) which is superior in heat resistance and corrosion resistance.

The inner tube 14 has a substantially cylindrical shape, and includes a top end and a bottom end which are opened. The outer tube 16 is installed in a substantial coaxial relationship with the inner tube 14 to cover the inner tube 14. A predetermined space is defined between the outer tube 16 and the inner tube 14. A top end of the outer tube 16 is closed while a bottom end thereof is opened.

A manifold 18 is installed below the outer tube 16. The manifold 18 is formed in a cylindrical shape and is formed of, e.g., a stainless steel (SUS). The manifold 18 is airtightly connected to the bottom end of the outer tube 16. In addition, a support ring 20 is formed to protrude from an inner wall surface of the manifold 18 which is integrally formed with the manifold 18. The support ring 20 supports the inner tube 14.

A lid 22 is installed below the manifold 18. The lid 22 is configured to move up and down by a boat elevator 24 connected to the lid 22. A lower portion (i.e., a throat portion) of the manifold 18 is closed when the lid 22 is moved up by the boat elevator 24. Meanwhile, the lower portion (i.e., the throat portion) of the manifold 18 is opened when the lid 22 is moved down by the boat elevator 24.

A wafer boat 26 is mounted on the lid 22. The wafer boat 26 is formed of, e.g., quartz. The wafer boat 26 is configured to support a plurality of wafers W in a vertically spaced-apart relationship.

A heat insulator 28 is installed around the vessel 12 to surround the vessel 12. Heaters (heating devices) 30 are installed on an inner wall surface of the heat insulator 28. The heaters 30 are configured by, e.g., resistance heating elements. An internal space of the vessel 12 is heated to a predetermined temperature by the heaters 30. Thus, the wafers W are heated.

One or more gas introduction pipes 32 are connected to a lateral surface of the manifold 18. The gas introduction pipe 32 is connected to the lateral surface of the manifold 18 at, e.g., a lower side of the support ring 20. A gas line configured by the gas introduction tube 32 is in communication with the inside of the vessel 12.

The gas introduction pipe 32 is connected to a gas feeding part GF. In one embodiment, the gas feeding part GF includes gas sources GS1, GS2, GS3, GS4, GS5, and GS6, values V11, V12, V21, V22, V31, V32, V41, V42, V51, V52, V61, and V62, and flow rate controllers (mass flow controllers) FC1, FC2, FC3, FC4, FC5, and FC6. The gas source GS1 is coupled to the gas introduction pipe 32 through the valve V11, the flow rate controller FC1, and the valve V12. The gas source GS2 is coupled to the gas introduction pipe 32 through the valve V21, the flow rate controller FC2, and the valve V22. The gas source GS3 is coupled to the gas introduction pipe 32 through the valve V31, the flow rate controller FC3, and the value V32. The gas source GS4 is coupled to the gas introduction pipe 32 through the valve V41, the flow rate controller FC4, and the valve V42. The gas source GS5 is coupled to the gas introduction pipe 32 through the valve V51, the flow rate controller FC5, and the valve V52. The gas source GS6 is coupled to the gas introduction pipe 32 through the valve V61, the flow rate controller FC6, and the valve V62.

The gas source GS1 is a source of a raw material gas for forming a seed layer. The gas source GS1 may be, for example, a source of an aminosilane-based gas. Examples of the aminosilane-based gas may include butylaminosilane (BAS), bis(tertiary-butylamino) silane (BTBAS), dimethylaminosilane (DMAS), bis(dimethylamino)silane (BDMAS), tri(dimethylamino)silane (TDMAS), diethylaminosilane (DEAS), bis(diethylamino)silane (BDEAS), dipropylaminosilane (DPAS), and diisopropylaminosilane (DIPAS). In some embodiments, an aminodisilane gas may be used as the aminosilane-based gas. In some embodiments, examples of the aminosilane-based gas may include diisopropylaminodisilane ($Si_2H_5N(iPr)_2$), diisopropylaminotrisilane ($Si_3H_7N$ (iPr)$_2$), diisopropylaminodichlorosilane (Si$_2$H$_4$ClN(iPr)$_2$), and diisopropylaminotrichlorosilane (Si$_3$H$_6$ClN(iPr)$_2$). In some embodiments, the gas source GS1 may be a source of a high-order silane gas such as a disilane gas, a trisilane gas, or a tetrasilane gas.

The gas source GS2 is a source of a raw material gas included in a third gas which is used in steps ST2 and ST7 which will be described later. Also, the gas source GS2 is a source of a raw material gas included in a first gas which is used in step ST3 and a source of a raw material gas included in a second gas which is used in step ST8. The gas source GS2 may be a source of a silicon-containing gas, a germanium-containing gas, or a mixture gas of the silicon-containing gas and the germanium-containing gas. Specifically, when liner layers and thin films, which are formed in steps ST2, ST3, ST7, and ST8, are made of silicon, the gas source GS2 is the source of the silicon-containing gas. Examples of the silicon-containing gas may include a monosilane gas, a disilane gas, or the above-described aminosilane-based gas. When the liner layers and the thin films, which are formed in steps ST2, ST3, ST7, and ST8, are made of germanium, the gas source GS2 is the source of the germanium-containing gas such as mono germanium. When the liner layers and the thin films, which are formed in steps ST2, ST3, ST7, and ST8, are made of silicon germanium, the gas source GS2 may be the source of the mixture gas of the silicon-containing gas and the germanium-containing gas as described above.

The gas source GS3 is a source of a raw material gas that causes an impurity. An example of the impurity may include arsenic (As), boron (B), or phosphorus (P). An example of the impurity-causing raw material gas may include phosphine (PH$_3$), diborane (B$_2$H$_6$), boron trichloride (BCl$_3$), and arsine (AsH$_3$).

The gas source GS4 is a source of an additional gas. An example of the additional gas may include a C$_2$H$_4$ gas, an N$_2$O gas, an NO gas or an NH$_3$ gas. In some embodiments, one or more of the C$_2$H$_4$ gas, the N$_2$O gas, the NO gas, and the NH$_3$ gas may be used as the additional gas.

The gas source GS5 is a source of an inert gas that can be used in annealing. An example of the inert gas may include a hydrogen gas (H$_2$ gas), a nitrogen gas (N$_2$ gas), or the like.

The gas source GS6 is a source of an etching gas included in a fourth gas and a fifth gas which are respectively used in steps ST5 and ST10. A gas containing one or more of Cl$_2$, HCl, F$_2$, Br$_2$, and HBr may be used as the etching gas. An arbitrary gas may be used as the etching gas as long as it can selectively etch a seed layer, a liner layer, a first thin film, and a second thin film (which will be described later), with respect to the insulating film IF and an epitaxial region.

As shown in FIG. 5, an exhaust port 34 through which a gas present inside the vessel 12 is exhausted, is formed in the lateral surface of the manifold 18. The exhaust port 34 is formed higher that the support ring 20 to communicate with the space defined between the inner tube 14 and the outer tube 16 of the vessel 12. This allows an exhaust gas generated within the inner tube 14 to be discharged to the exhaust port 34 through the space defined between the inner tube 14 and the outer tube 16.

The manifold 18 is connected to a purge gas supply pipe 36. The purge gas supply pipe 36 is connected to the manifold 18 below the exhaust port 34. The purge gas supply pipe 36 is connected to a purge gas supply source (not shown). A purge gas, e.g., a nitrogen gas, is supplied from the purge gas supply source into the vessel 12 through the purge gas supply pipe 36.

The exhaust port 34 is air-tightly connected to an exhaust pipe 38. A valve 40 and an exhaust device (P) 42 such as a vacuum pump are installed in the exhaust pipe 38 in the named order from an upstream side. The valve 40 regulates an opening degree of the exhaust pipe 38, thereby controlling an internal pressure of the vessel 12 at a predetermined pressure. The exhaust device 42 exhausts the exhaust gas within the vessel 12 through the exhaust pipe 38, consequently regulating the internal pressure of the vessel 12. In addition, a trap, a scrubber (both not shown) and the like may be installed in the exhaust pipe 38. Using these trap and scrubber, the processing apparatus 10 may be configured to detoxify the exhaust gas exhausted from the vessel 12 before the exhaust gas is exhausted outside of the processing apparatus 10.

Figure 6:
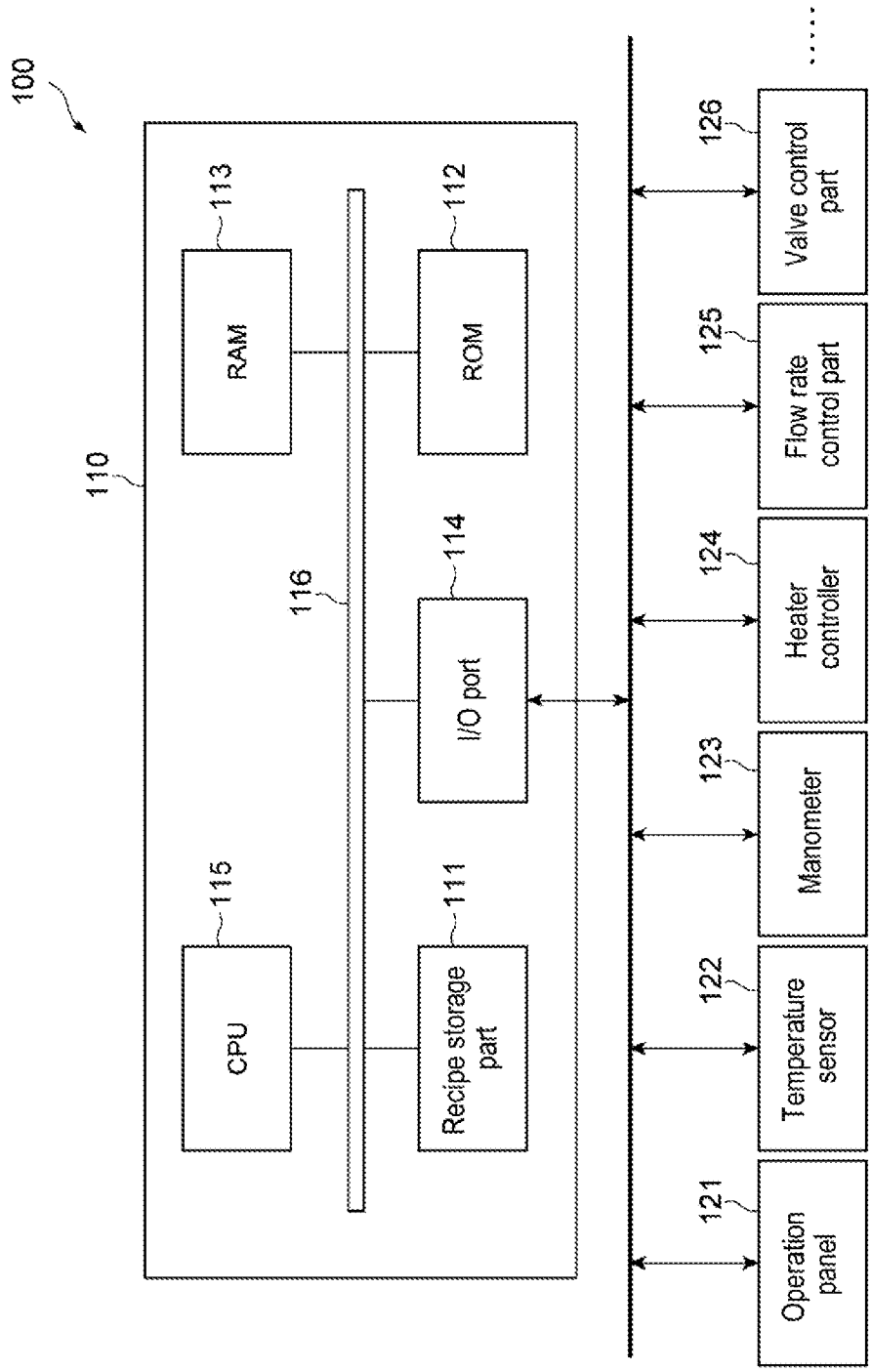
FIG. 6 is an exemplary view illustrating a configuration of a control part of the processing apparatus shown in FIG. 5.

Further, the processing apparatus 10 includes a control part 100 which controls respective components of the processing apparatus 10. FIG. 6 illustrates a configuration of the control part 100. As shown in FIG. 6, the control part 100 includes a main control part 110. The main control part 110 is connected to an operation panel 121, a temperature sensor (group) 122, a manometer (group) 123, a heater controller 124, a flow rate control part 125, a valve control part 126, and the like.

The operation panel 121 includes a display screen and operation buttons, and sends operation instructions of an operator to the main control part 110. Also, the operation panel 121 allows the display screen to display various kinds of information provided from the main control part 110 thereon.

The temperature sensor (group) 122 measures internal temperatures of the respective components such as the vessel 12, the gas introduction pipe 32 and the exhaust pipe 38, and notifies the main control part 110 of the measured temperature values. The manometer (group) 123 measures internal pressures of the respective components such as the vessel 12, the gas introduction pipe 32 and the exhaust pipe 38, and notifies the main control part 110 of the measured pressure values.

The heater controller 124 is designed to separately control the heaters 30 and apply electric current to the heaters 30 in response to the instructions provided from the main control part 110, thereby causing the heaters 30 to generate heat. Also, the heater controller 124 separately measures power consumptions of the heaters 30 and notifies the main control part 110 of the measured power consumptions.

The flow rate control part 125 controls each of the flow rate controllers FC1 to FC6 of the gas feeding part GF, thereby setting a flow rate of each gas flowing through the gas introduction pipe 32 to a value instructed by the main control part 110. Also, the flow rate control part 125 measures a flow rate of each gas actually flowing through a respective flow rate controller and notifies the main control part 110 of the measured flow rate. The valve control part 126 controls an opening degree of a respective value, based on a value instructed by the main control part 110.

The main control part 110 includes a recipe storage part 111, a ROM 112, a RAM 113, an I/O port 114, a central processing unit (CPU) 115, and a bus 116 which interconnects them to one another.

The recipe storage part 111 stores a setup recipe and a plurality of process recipes. Only the setup recipe is stored in the recipe storage part 111 when the processing apparatus 10 is manufactured first. The setup recipe is executed to generate heating models corresponding to different processing apparatuses. The process recipes are prepared in a corresponding relationship with the processes actually performed pursuant to the user's desire. For example, the process recipes define a change in temperature of the respective components, a change in internal pressure of the vessel 12, start and stop timings for supplying a processing gas, a supply amount of the processing gas and the like, from the time when the wafers W are loaded into the vessel 12 to the time when the processed wafers W are unloaded from the vessel 12.

The ROM 112 includes an EEPROM, a flash memory, a hard disk and the like. The ROM 112 is a storage medium for storing an operation program of the CPU 115. The RAM 113 serves as a work area of the CPU 115.

The I/O port 114 is connected to the operation panel 121, the temperature sensor (group) 122, the manometer (group) 123, the heater controller 124, the flow rate control part 125, the valve control part 126, and the like, to control the input and output of data or signals.

The CPU 115 constitutes the core of the main control part 110 and executes a control program stored in the ROM 112. In response to the instructions provided from the operation panel 121, the CPU 115 controls the operation of the processing apparatus 10 according to the recipes (process recipes) stored in the recipe storage part 111. That is to say, the CPU 115 controls the temperature sensor (group) 122, the manometer (group) 123, the flow rate control part 125, and the like to respectively measure the internal temperatures, the internal pressures, the flow rates of the respective components such as the vessel 12, the gas introduction pipe 32, the exhaust pipe 38 and the like. Based on the measured data, the CPU 115 outputs control signals to the heater controller 124, the flow rate control part 125, the valve control part 126 and the like, and controls the respective components pursuant to the process recipes. The bus 116 transmits information between the respective components.

Next, the above-described method MT, which can be implemented using the processing apparatus 10, will be described in detail again referring to FIGS. 1 to 4.

In the method MT according to one embodiment, step ST1 is first performed, as shown in FIG. 1. In step ST1, a seed layer SF is formed. As shown in FIG. 2B, the seed layer SF is formed on a wall surface defining a recess DR. The seed layer SF is formed at a thickness of, e.g., 0.1 nm so as not to occlude the recess DR. The wall surface on which the seed layer SF is formed includes a side wall surface SW defining the recess DR at a lateral side and a bottom surface BW defining the recess DR at a bottom side. In step ST1, the seed layer SF is also formed on a top surface TW of the insulating film IF.

In step ST1, in order to form the seed layer SF, a raw material gas such as the aminosilane-based gas or the high-order silane gas is supplied at a predetermined flow rate into the vessel 12 having the wafers W accommodated therein. The internal pressure of the vessel 12 is set to a predetermined pressure, and the internal temperature of the vessel 12 is also set to a predetermined temperature. In step ST1, the predetermined flow rate of the raw material gas falls within a range of, e.g., 10 to 500 sccm. In addition, the predetermined pressure falls within a range of, e.g., 0.1 Torr (13.33 Pa) to 10 Torr (1333 Pa). The predetermined temperature falls within a range of, e.g., 300 to 600 degrees C.

When step ST1 is performed using the processing apparatus 10, the control part 100 executes a sixth control described below. That is to say, in the sixth control, the control part 100 controls the valve V11, the flow rate controller FC1 and the valve V12 such that the raw material gas of the predetermined flow rate is supplied from the gas source GS 1 into the vessel 12. The control part 100 also controls the exhaust device 42 such that the internal pressure of the vessel 12 is set to the predetermined pressure. The control part 100 also controls the heaters 30 such that the internal temperature of the vessel 12 is set to the predetermined temperature.

The seed layer SF is not limited to a single layer formed by the aminosilane-based gas or the high-order silane gas. As an example, the seed layer SF may be formed by: forming a silicon-containing first layer through an adsorption or deposition of the aminosilane-based gas; and forming a silicon-containing second layer on the first layer using the high-order silane gas.

Subsequently, in step ST2, a liner layer LF is formed as shown in FIG. 2C. The liner layer LF, which is an amorphous semiconductor layer, includes an amorphous silicon layer, an amorphous germanium layer, or an amorphous silicon germanium layer. The liner layer SF is formed along the side wall surface SW, the bottom surface BW and the top surface TW. In addition, the liner layer LF is formed at a thickness of, e.g., 0.5 to 10 nm so as not to occlude the recess DR. In some embodiments, the liner layer LF may contain an impurity. For example, the impurity is an atom such as B, P or As. In some embodiments, the liner layer LF may be an undoped amorphous semiconductor layer. In FIG. 2C, while the liner layer LF is shown to be formed on the seed layer SF, the liner layer SF may be directly formed on the side wall surface SW, the bottom surface BW and the top surface TW. That is to say, step ST1 in the method MT may be omitted.

In step ST2, the third gas is supplied into the vessel 12 in which the wafers W are accommodated. The third gas includes a raw material gas, i.e., the silicon-containing gas, the germanium-containing gas, or the mixture gas of the silicon-containing gas and the germanium-containing gas as described above. The raw material gas is supplied into the vessel 12 at a flow rate of, e.g., 50 to 5,000 sccm. In step ST2, the internal pressure of the vessel 12 is set to a predetermined pressure, and the internal temperature of the vessel 12 is set to a predetermined temperature. The predetermined pressure falls within a range of, e.g., 0.1 Torr (13.33 Pa) to 10 Torr (1,333 Pa). The predetermined temperature falls within a range of, e.g., 300 to 600 degrees C.

In some embodiments, the third gas may further contain an impurity-causing raw material gas. An example of the impurity-causing raw material gas may include phosphine ($PH_3$), diborane ($B_2H_6$), boron trichloride ($BCl_3$), or arsine ($AsH_3$). The impurity-causing raw material gas is supplied into the vessel 12 at, e.g., a flow rate ranging from 1 to 1,000 sccm.

In addition, the third gas may further include an additional gas. An example of the additional gas may include one or more of a $C_2H_4$ gas, an $N_2O$ gas, an NO gas and an $NH_3$ gas. In step ST2, a flow rate of the additional gas is set to fall within a range of, e.g., 5 to 1,000 sccm.

When step ST2 is performed using the processing apparatus 10, the control part 100 executes a fifth control described below. That is to say, in the fifth control, the control part 100 controls the valve V21, the flow rate controller FC2 and the valve V22 such that the raw material gas of the predetermined flow rate is supplied from the gas source GS2 into the vessel 12. The control part 100 also controls the exhaust device 42 such that the internal pressure of the vessel 12 is set to the predetermined pressure. The control part 100 also controls the heaters 30 such that the internal temperature of the vessel 12 is set to the predetermined temperature. In addition, when the third gas further includes the impurity-causing raw material gas, the control part 100 controls the valve 31, the flow rate controller FC3 and the valve 32 such that the impurity-causing raw material gas of a predetermined flow rate is supplied from the gas source GS3 into the vessel 12. Further, when the third gas further includes the additional gas, the control part 100 controls the valve 41, the flow rate controller FC4 and the valve 42 such that the additional gas of a predetermined flow rate is supplied from the gas source GS4 into the vessel 12.

In a subsequent step ST3, a first thin film TF1 is formed as shown in FIG. 3A. When the semiconductor substrate SB is a single crystalline semiconductor substrate, the first thin film TF1 is a polycrystalline semiconductor layer or an amorphous semiconductor layer. When the semiconductor substrate SB is a polycrystalline semiconductor substrate, the first thin film TF1 is an amorphous semiconductor layer. The first thin film TF1 is formed along the wall surface defining the recess DR. For example, the first thin film TF1 is formed along the side wall surface SW, the bottom surface BW and the top surface TW. While in the above embodiment, the first thin film TF1 is shown to be formed on the seed layer SF followed by the liner layer LF, the first thin film TF1 may be directly formed on the side wall surface SW, the bottom surface BW and the top surface TW. That is to say, steps ST1 and ST2 in the method MT may be omitted. A thickness of the first thin film TF1 is set to have a thickness of, e.g., 12.5 nm. In some embodiments, the first thin film TF1 may contain an impurity. An impurity similar to that contained in the liner layer LF may be used as the impurity which is contained in the first thin film TF1.

In step ST3, in order to form the first thin film TF1, the first gas is supplied into the vessel 12 having the wafers W accommodated therein. The first gas includes a raw material gas, i.e., the silicon-containing gas, the germanium-containing gas, or the mixture gas of the silicon-containing gas and the germanium-containing gas as described above. In step ST3, the internal pressure of the vessel 12 is set to a predetermined pressure, and the internal temperature of the vessel 12 is set to a predetermined temperature. In step ST3, the raw material gas is supplied into the vessel 12 at, e.g., a flow rate ranging from 50 to 5,000 sccm. In step ST3, the predetermined pressure falls within a range of, e.g., 0.1 Torr (13.33 Pa) to 10 Torr (1333 Pa). The predetermined temperature falls within a range of, e.g., 300 to 700 degrees C. When the impurity is contained in the first thin film TF1, a flow rate of the impurity-causing raw material gas in the first gas used in step ST3 is set to fall within a range of, e.g., 5 to 1,000 sccm.

In some embodiments, the first gas may further include an additional gas. An example of the additional gas may include one or more of a $C_2H_4$ gas, an $N_2O$ gas, an NO gas and an $NH_3$ gas. In step ST3, a flow rate of the additional gas is set to fall within a range of, e.g., 5 to 1,000 sccm.

When step ST3 is performed using the processing apparatus 10, the control part 100 executes a first control described below. In the first control, the control part 100 controls the valve V21, the flow rate controller FC2 and the valve V22 such that the raw material gas of a predetermined flow rate is supplied from the gas source GS2 into the vessel 12. The control part 100 also controls the exhaust device 42 such that the internal pressure of the vessel 12 is set to the predetermined pressure. The control part 100 also controls the heaters 30 such that the internal temperature of the vessel 12 is set to the predetermined temperature. In addition, when the impurity is contained in the first thin film TF1, the control part 100 may control the valve 31, the flow rate controller FC3 and the valve 32 such that the impurity-causing raw material gas of a predetermined flow rate is supplied from the gas source GS3 into the vessel 12. In addition, when the additional gas is also used in step ST3, the control part 100 may control the valve 41, the flow rate controller FC4 and the valve 42 such that the additional gas of a predetermined flow rate is supplied from the gas source GS4 into the vessel 12.

In a subsequent step ST4, as shown in FIG. 3B, an epitaxial region EPR is formed at one portion of the first thin film TF1. Specifically, the epitaxial region EPR, which is generated by crystallizing the semiconductor material constituting the first thin film TF1 in the semiconductor substrate SB without substantially moving the first thin film TF1. That is to say, the epitaxial region EPR having the same crystal structure as that of the semiconductor substrate SB is formed from the semiconductor material of the first thin film TF1. The epitaxial region EPR extends along the surface of the semiconductor substrate SB, which defines the recess DR. In step ST4, in order to form the epitaxial region EPR, the wafer W is annealed within the vessel 12 whose internal pressure is set to a first pressure.

Specifically, in step ST4, the internal temperature of the vessel 12 having the wafers W accommodated therein is set to a predetermined temperature. For example, the predetermined internal temperature falls within a range of 300 to 600 degrees C. In step ST4, the internal pressure of the vessel 12 is set to the first pressure. The first pressure is higher than 1 Torr (133.3 Pa). In some embodiments, the first pressure may be equal to or lower than 760 Torr (101,300 Pa). In step ST4, an inert gas such as a hydrogen gas or a nitrogen gas may be supplied into the vessel 12.

When step ST4 is performed using the processing apparatus 10, the control part 100 executes a second control described below. That is to say, in the second control, the control part 100 controls the exhaust device 42 such that the internal pressure of the vessel 12 is set to the first pressure. The control part 100 also controls the heaters 30 such that the internal temperature of the vessel 12 is set to the predetermined temperature. When the inert gas is used, the control part 100 controls the valve 51, the flow rate controller FC5 and the valve 52 such that the inert gas of a predetermined flow rate is supplied from the gas source GS5 into the vessel 12.

In a subsequent step ST5, the remaining portion of the first thin film TF1, which is left without forming the epitaxial region EPR, is etched. In step ST5, the fourth gas is supplied at a predetermined flow rate into the vessel 12 having the wafers W accommodated therein. The fourth gas may contain one or more of $Cl_2$, HCl, $F_2$, $Br_2$, and HBr. The predetermined flow rate of the fourth gas may fall within a range of from 10 to 5,000 sccm. In step ST5, the internal pressure of the vessel 12 is set to a predetermined pressure, and the internal temperature of the vessel is set to a predetermined temperature. The predetermined internal pressure of the vessel 12 in step ST5 falls within a range of, e.g., from $1\times10^{-10}$ Torr ($1.333\times10^{-7}$ Pa) to 100 Torr ($133.3\times10^2$ Pa), and the predetermined internal temperature of the vessel 12 in step ST5 falls within a range of, e.g., from 200 to 700 degrees C. An etching rate of the first thin film TF1 by the fourth gas is higher than that of the epitaxial region EPR by the fourth gas. Thus, as a result of step ST5, as shown in FIG. 3C, the first thin film TF 1 can be removed with the epitaxial region EPR left. In addition, when the seed layer SF and the liner layer LF have been formed, these layers are also removed in step ST5.

When step ST5 is performed using the processing apparatus 10, the control part 100 executes a seventh control described below. In the seventh control, the control part 100 controls the valve V61, the flow rate controller FC6 and the valve V62 such that the fourth gas of the predetermined flow rate is supplied from the gas source GS6 into the vessel 12. The control part 100 controls the exhaust device 42 such that the internal pressure of the vessel 12 is set to the predetermined pressure. The control part 100 controls the heaters 30 such that the internal temperature of the vessel 12 is set to the predetermined temperature.

In a subsequent step ST6, a seed layer SF' is further formed. A process of forming the seed layer SF' in step ST6 is similar to the process of forming the seed layer SF in step ST1. Subsequently, in step ST7, a liner layer LF' is further formed. A process of forming the liner layer LF' in step ST7 is similar to the process of forming the liner layer LF in step ST2.

In a subsequent step ST8, a second thin film TF2 is formed. The second thin film TF2 is formed along the surface defining the recess DR so as not to occlude the recess DR. A process of forming the second thin film TF2 in step ST8 is similar to the process of forming the first thin film TF1 in step ST3. In step ST8, the second gas similar to the first gas is used. When step ST8 is performed using the processing apparatus 10, a third control similar to the first control is executed by the control part 100.

By a sequence of steps ST6, ST7 and ST8, as shown in FIG. 4A, the seed layer SF', the liner layer LF' and the second thin film TF2 are sequentially formed on the wall surface defining the recess DR and the top surface of the insulating film IF. Here, the wall surface defining the recess DR includes a side wall surface defining the recess DR and a surface of the epitaxial region EPR. In some embodiments, one or both of steps ST6 and ST7 may be omitted in the method MT. In the case where one of steps ST6 and ST7 is omitted, the second thin film TF2 is formed on the seed layer SF' or the liner layer LF'. In the case where both steps ST6 and ST7 are omitted, the second thin film TF2 is directly formed on the wall surface defining the recess DR and the top surface of the insulating film IF.

Figure 4B:
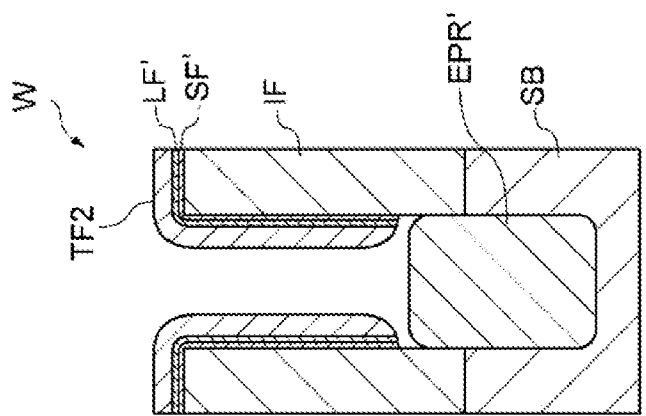

In a subsequent step ST9, as shown of FIG. 4B, an epitaxial region EPR' is further formed from the semiconductor material of the second thin film TF2. Specifically, in step ST9, the semiconductor material of the second thin film TF2 moves toward the bottom of the recess DR, and undergoes a solid-phase epitaxial growth so as to have the same crystal structure as that of the epitaxial region EPR which has already formed. Thus, the epitaxial region EPR extends within the recess DR as the epitaxial region EPR'. To do this, in step ST9, the wafers W are annealed in the vessel 12 whose internal pressure is set to a second pressure. The second pressure is lower than the first pressure.

Specifically, in step ST9, the internal temperature of the vessel 12 having the wafers W accommodated therein is set to a predetermined temperature. For example, the predetermined internal temperature of the vessel 12 falls within a range of from 300 to 600 degrees C. Further, in step ST9, the internal pressure of the vessel is set to the second pressure. The second pressure is equal to or lower than 1 Torr (133.3 Pa). Further, the second pressure is equal to or higher than $1.0 \times 10^{-10}$ Torr ($1.333 \times 10^{-7}$ Pa). In step ST9, an inert gas such as a hydrogen gas or a nitrogen gas may be supplied into the vessel 12.

When step ST9 is performed using the processing apparatus 10, the control part 100 executes a fourth control described below. That is to say, in the fourth control, the control part 100 controls the exhaust device 42 such that the internal pressure of the vessel 12 is set to the second pressure. The control part 100 controls the heaters 30 such that the internal temperature of the vessel 12 is set to the predetermined temperature. In addition, when the inert gas is used, the control part 100 controls the valve V51, the flow rate controller FC5 and the valve V52 such that the inert gas of a predetermined flow rate is supplied from the gas source GS5 into the vessel 12.

Figure 4C:
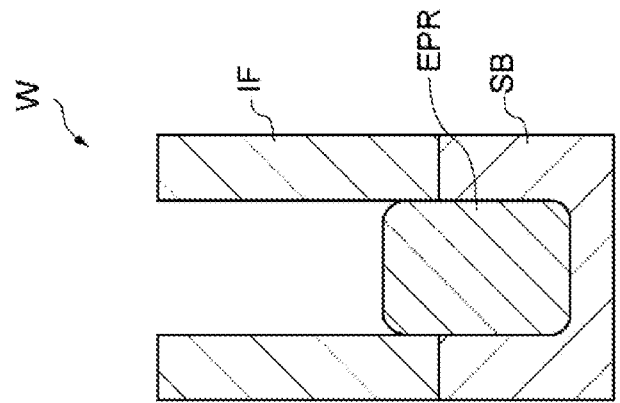

In a subsequent step ST10, the remaining portion of the second thin film TF2, which is left without forming the epitaxial region EPR', is etched. In step ST10, the fifth gas is supplied at a predetermined flow rate into the vessel 12 having the wafers W accommodated therein. The fifth gas may contain one or more of $Cl_2$, HCl, $F_2$, $Br_2$, and HBr. The flow rate of the fifth gas falls within a range of, e.g., from 10 to 5,000 sccm. In step ST10, the internal pressure of the vessel 12 is set to a predetermined pressure, and the internal temperature of the vessel 12 is set to a predetermined temperature. The predetermined internal pressure of the vessel 12 in step ST10 falls within a range of, e.g., from $1 \times 10^{-10}$ Torr ($1.333 \times 10^{-7}$ Pa) to 100 Torr ($133.3 \times 10^2$ Pa). The predetermined internal temperature of the vessel 12 in step ST10 falls within a range of, e.g., from 200 to 700 degrees C. An etching rate of the second thin film TF2 by the fifth gas is higher than the etching rate of the epitaxial region EPR' by the fifth gas. Thus, as a result of step ST10, as shown in FIG. 4C, the second thin film TF2 can be removed with the epitaxial region EPR' left. In addition, in the case where the seed layer SF' and the liner layer LF' have been formed, these layers are also removed in step ST10.

When step ST10 is performed using the processing apparatus 10, the control part 100 executes an eighth control described below. That is to say, in the eighth control, the control part 100 controls the valve V61, the flow rate controller FC6 and the valve V62 such that the fifth gas of the predetermined flow rate is supplied from the gas source GS6 into the vessel 12. The control part 100 controls the exhaust device 42 such that the internal pressure of the vessel 12 is set to the predetermined pressure. The control part 100 also controls the heaters 30 such that the internal temperature of the vessel 12 is set to the predetermined temperature.

In a subsequent step STa, it is determined whether an end condition is satisfied. The end condition is satisfied when the number of repetitions of the sequence SQ including steps ST8 and ST9 reaches a predetermined number of times. The predetermined number of times is one or more. If it is determined in step STa that the end condition is not satisfied, the sequence SQ is repeated. Meanwhile, if it is determined in step STa that the end condition is satisfied, the method MT is ended.

In the method MT, when the annealing in step ST4 is performed, the semiconductor material constituting the first thin film TF1 is crystallized without substantially moving the semiconductor material. Thus, the epitaxial region EPR is formed along the wall surface defining the recess DR independently of whether or not the damage region exists. This suppresses a cavity from being generated in the epitaxial region EPR filled into the recess DR.

As described above, in the above embodiment, the liner layer LF (or LF') is formed between the first thin film TF1 (or the second thin film TF2) and the underlying layer (the seed layer SF (or SF') or the insulating film IF, and the semiconductor substrate SB). This alleviates a difference in stress between the first thin film TF1 (or the second thin film TF2) and the underlying layer. In addition, when the liner layer LF contains the impurity, a relatively flat surface is provided. Since the liner layer LF containing the impurity can be grown at a low temperature, it is possible to reduce a heat history applied to the wafer W, thus reducing the stress of the liner layer LF. This suppresses the generation of the cavity caused by condensation of the semiconductor material. When the liner layer LF (or LF') is an undoped layer, and when the first thin film TF1 (or the second thin film TF2) contains an impurity (dopant), it is possible to suppress migration caused by the annealing.

As described above, in the above embodiment, the seed layer SF (or SF') is formed. By the seed layer SF (or SF'), a surface energy at an interface between a layer formed on the seed layer SF (or SF'), e.g., the liner layer LF (or LF') or the first thin film TF1 (or the second thin film TF2), and the underlying layer, is reduced. This improves a flatness of the layer formed on the seed layer SF (or SF').

While different embodiments have been described, the present disclosure is not limited to these embodiments but may be configured in many modified forms. As an example, step ST9 may be performed just after step ST4 without performing step ST5 and subsequent steps ST6, ST7 and ST8. That is to say, when an initial sequence SQ is performed, the epitaxial region EPR may be extended to the epitaxial region EPR' by the annealing in step ST9, using the remaining portion of first thin film TF1 which is not used in forming the epitaxial region EPR in step ST4.

According to some embodiments of the present disclosure, it is possible to suppress, when filling a recess by an epitaxial growth of a semiconductor material, a void from being generated in an epitaxial growth region.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a recess of a workpiece, the workpiece having a semiconductor substrate and an insulating film formed on the semiconductor substrate, the recess penetrating the insulating film and extending to an inside of the semiconductor substrate, the method comprising:
    forming a first thin film made of a semiconductor material along a wall surface defining the recess in the semiconductor substrate;
    annealing the workpiece within a vessel whose internal process is set to a first pressure, and forming an epitaxial region which is generated by crystallizing the semiconductor material of the first thin film, along a surface defining the recess in the semiconductor substrate, without moving the first thin film;
    forming a second thin film made of the semiconductor material along the wall surface defining the recess; and
    annealing the workpiece within the vessel whose internal pressure is set to a second pressure lower than the first pressure, and forming a further epitaxial region which is generated by crystallizing the semiconductor material of the second thin film which is moved toward a bottom of the recess.

2. The method of claim 1, wherein the first pressure is higher than 133.3 Pa, and the second pressure is equal to or lower than 133.3 Pa.

3. The method of claim 1, further comprising: between forming an epitaxial region and forming a second thin film, etching the first thin film.

4. The method of claim 1, further comprising: after forming a further epitaxial region, etching the second thin film.

5. The method of claim 1, further comprising: before forming at least one of the first thin film and the second thin film, forming a liner layer that is an amorphous semiconductor layer.

6. The method of claim 5, further comprising: before forming the liner layer, forming a seed layer using an aminosilane-based gas or a high-order silane gas.

* * * * *